(12) United States Patent
Asam

(10) Patent No.: US 7,482,876 B2
(45) Date of Patent: Jan. 27, 2009

(54) AMPLIFIER CIRCUIT AND METHOD FOR AMPLIFYING A SIGNAL TO BE AMPLIFIED

(75) Inventor: Michael Asam, OT Sainbach (DE)

(73) Assignee: Infineon Technologies AG, Munich (DE)

( * ) Notice: Subject to any disclaimer, the term of this patent is extended or adjusted under 35 U.S.C. 154(b) by 71 days.

(21) Appl. No.: 11/494,433

(22) Filed: Jul. 27, 2006

(65) Prior Publication Data

US 2007/0026747 A1 Feb. 1, 2007

(30) Foreign Application Priority Data

Jul. 27, 2005 (DE) .................. 10 2005 035 150

(51) Int. Cl.
*H03F 3/04* (2006.01)
(52) U.S. Cl. ...................... 330/296; 330/288
(58) Field of Classification Search .......... 330/285, 330/288, 296
See application file for complete search history.

(56) References Cited

U.S. PATENT DOCUMENTS 6,043,714 A * 3/2000 Yamamoto et al. ......... 330/296
6,313,705 B1 11/2001 Dening et al.
6,414,553 B1 * 7/2002 Luo ........................ 330/296
7,259,615 B2 * 8/2007 Sasho et al. ............... 327/545
7,345,547 B2 * 3/2008 Wang et al. ............... 330/285

* cited by examiner

*Primary Examiner*—Robert Pascal
*Assistant Examiner*—Hieu P Nguyen
(74) *Attorney, Agent, or Firm*—Eschweiler & Associates, LLC

(57) ABSTRACT

An amplifier circuit includes a first series circuit connected between a supply voltage and a reference potential. The first series circuit includes a current source, a first tap and a first component configured as a diode. The amplifier circuit also includes a second series circuit connected between the supply voltage and the reference potential, and includes a controlled path between a first connection and a second connection of a first transistor and a second tap. The control connection of the first transistor is coupled to the first tap. The second tap is used to output a bias voltage. The amplifier circuit includes an amplifier stage coupled to the second tap for setting an operating point of the amplifier stage.

15 Claims, 5 Drawing Sheets

AMPLIFIER CIRCUIT AND METHOD FOR AMPLIFYING A SIGNAL TO BE AMPLIFIED

REFERENCE TO RELATED APPLICATIONS

This application claims the benefit of the priority date of German application DE 10 2005 035 150.6, filed on Jul. 27, 2005, the contents of which are herein incorporated by reference in their entirety.

FIELD OF THE INVENTION

The present invention relates to the field of electronics and, in particular, to an amplifier circuit and to a method for amplifying a signal to be amplified.

BACKGROUND OF THE INVENTION

Amplifier circuits are used in a number of areas of electronics, for example mobile communications technology and industrial electronics.

Power amplifiers, for instance in communications technology, require amplifier stages with operating point setting. This is usually effected by feeding a quiescent current into an amplifier transistor with the aid of a current mirror or by applying a bias voltage.

FIGS. 3A and 3B show an amplifier stage that is known to the inventor and a circuit which is known to the inventor that is intended to generate a bias voltage.

FIG. 3A shows an amplifier stage having an npn bipolar transistor 7 which converts a signal U-IN to be amplified into an amplified signal U-OUT. A bias voltage for the transistor 7 is generated using a current source 4 and a further npn bipolar transistor 5.

FIG. 3B shows a circuit for generating a bias voltage with details needed to implement the current source 4 shown in FIG. 3A. The current source 4 has two pnp bipolar transistors 10, 11 and a reference current source 12. Two transistors 10, 11 which are complementary to the transistors 5, 7 are thus provided in order to implement the current source 4.

An amplifier circuit should have bias setting with a low area requirement and should therefore be capable of being implemented in a cost-effective manner. A method should make it possible to set the amplifier in a flexible manner.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present one or more concepts of the invention in a simplified form as a prelude to the more detailed description that is presented later.

In one embodiment, an amplifier circuit comprises a first series circuit which is connected between a supply voltage connection and a reference potential connection and comprises a current source, a first tap which is connected between the current source and the reference potential connection and a first component, which is connected as a diode, and a first impedance, which are connected between the first tap and the reference potential connection. The amplifier circuit comprises a second series circuit which is connected between the supply voltage connection and the reference potential connection. the second series circuit mirrors a first current, which flows in the first series circuit, with scaling, and comprises a controlled path between a first connection and a second connection of a first transistor. The first transistor has a control connection coupled to the first tap, and a second impedance which is connected between the controlled path of the first transistor and the reference potential connection and whose first connection is connected to the controlled path of the first transistor and whose second connection is connected to a second tap at which a bias voltage can be tapped off. The first and second impedances can be used to set a ratio between a second current flowing in the second series circuit and the first current. The amplifier circuit comprises an amplifier stage which is coupled to the second tap for setting an operating point of the amplifier stage.

In another embodiment, an amplifier circuit comprises a first series circuit which is connected between a supply voltage connection and a reference potential connection. The first series circuit comprises a current source, a first tap which is connected between the current source and the reference potential connection and a first component, which is connected as a diode, and a first impedance, which are connected between the first tap and the reference potential connection. The amplifier circuit further comprises a second series circuit which is connected between the supply voltage connection and the reference potential connection. The second series circuit comprises a controlled path between a first connection and a second connection of a first transistor whose control connection is coupled to the first tap, and a second impedance which is connected between the controlled path of the first transistor and the reference potential connection, and whose first connection is connected to the controlled path of the first transistor and whose second connection is connected to a second tap which is used to output a bias voltage. The amplifier circuit comprises an amplifier stage which is coupled to the second tap for setting an operating point of the amplifier stage and comprises a second component which is connected as a diode and is connected between the second tap and the reference potential connection, a second transistor whose controlled path between a first connection and a second connection of the second transistor is connected between the supply voltage connection and the reference potential connection, and a third impedance which comprises a coil and couples a control connection of the second transistor to the second tap.

In another embodiment, an amplifier circuit comprises a first series circuit which is connected between a supply voltage connection and a reference potential connection. The first series circuit comprises a current source, a first tap which is connected between the current source and the reference potential connection, and a fourth transistor whose first connection and whose control connection are coupled to one another, and which is connected between the first tap and the reference potential connection. The amplifier circuit comprises a second series circuit which is connected between the supply voltage connection and the reference potential connection. The second series circuit mirrors a first current, which flows in the first series circuit, with scaling, and comprises a controlled path between a first connection and a second connection of a first transistor whose control connection is coupled to the first tap, and a second tap which is coupled to the controlled path of the first transistor and at which a bias voltage can be tapped off. The amplifier circuit comprises an amplifier stage which is coupled to the second tap for setting an operating point of the amplifier stage.

In another embodiment, an amplifier circuit comprises a means for supplying a first current, a means for mirroring the first current into a second current. These means are coupled to the means for supplying current, and a ratio between a second current and the first current is set. the amplifying circuit further comprises a means for amplifying a voltage, which is to be amplified, into an amplified voltage, wherein these means are coupled to the mirroring means in order to set an operating point of the amplification means.

One embodiment provides a method for amplifying a signal to be amplified. The method comprises generating a reference current which flows through a first impedance, and mirroring the reference current into a second current which flows through a second impedance. A ratio between the second current and the reference current depends on a ratio between the first impedance and the second impedance. The method further comprises using the second current to generate a bias voltage for supplying an amplifier stage, applying the signal to be amplified to an input of the amplifier stage, and outputting a signal which has been amplified using the amplifier stage.

Another embodiment provides a method for amplifying a signal to be amplified. The method comprises the steps of generating a reference current which flows through a first resistance, and mirroring the reference current into a second current which flows through a second resistance. A ratio between the second current and the reference current depends on a ratio between the first resistance and the second resistance. The method further comprises using the second current to generate a bias voltage for supplying an amplifier stage, applying the signal to be amplified to an input of the amplifier stage, and outputting a signal which has been amplified using the amplifier stage.

To the accomplishment of the foregoing and related ends, the invention comprises the features hereinafter fully described and particularly pointed out in the claims. The following description and the annexed drawings set forth in detail certain illustrative aspects and implementations of the invention. These are indicative, however, of but a few of the various ways in which the principles of the invention may be employed. Other objects, advantages and novel features of the invention will become apparent from the following detailed description of the invention when considered in conjunction with the drawings.

BRIEF DESCRIPTION OF THE DRAWINGS

The invention will be explained in more detail below using a plurality of exemplary embodiments and with reference to the figures.

DETAILED DESCRIPTION OF THE INVENTION

Functionally or operatively similar components bear the same reference symbols in the examples provided herein. If circuit parts in components and their function correspond, the description thereof will not be repeated in each of the subsequent figures.

Figure 1A:
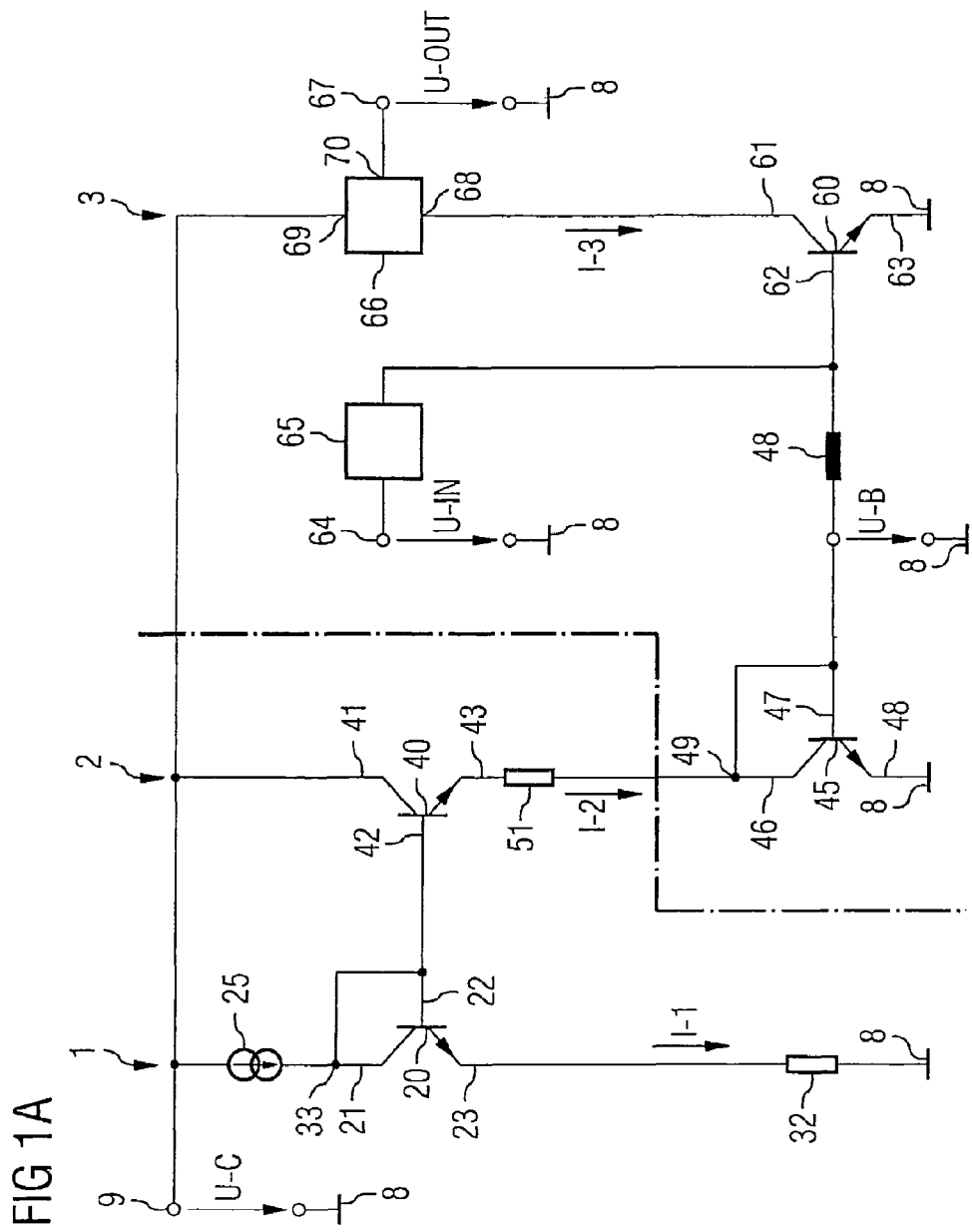
FIGS. 1A to 1C are schematic diagrams illustrating exemplary amplifier circuits according to an embodiment of the invention.
Figure 1B:
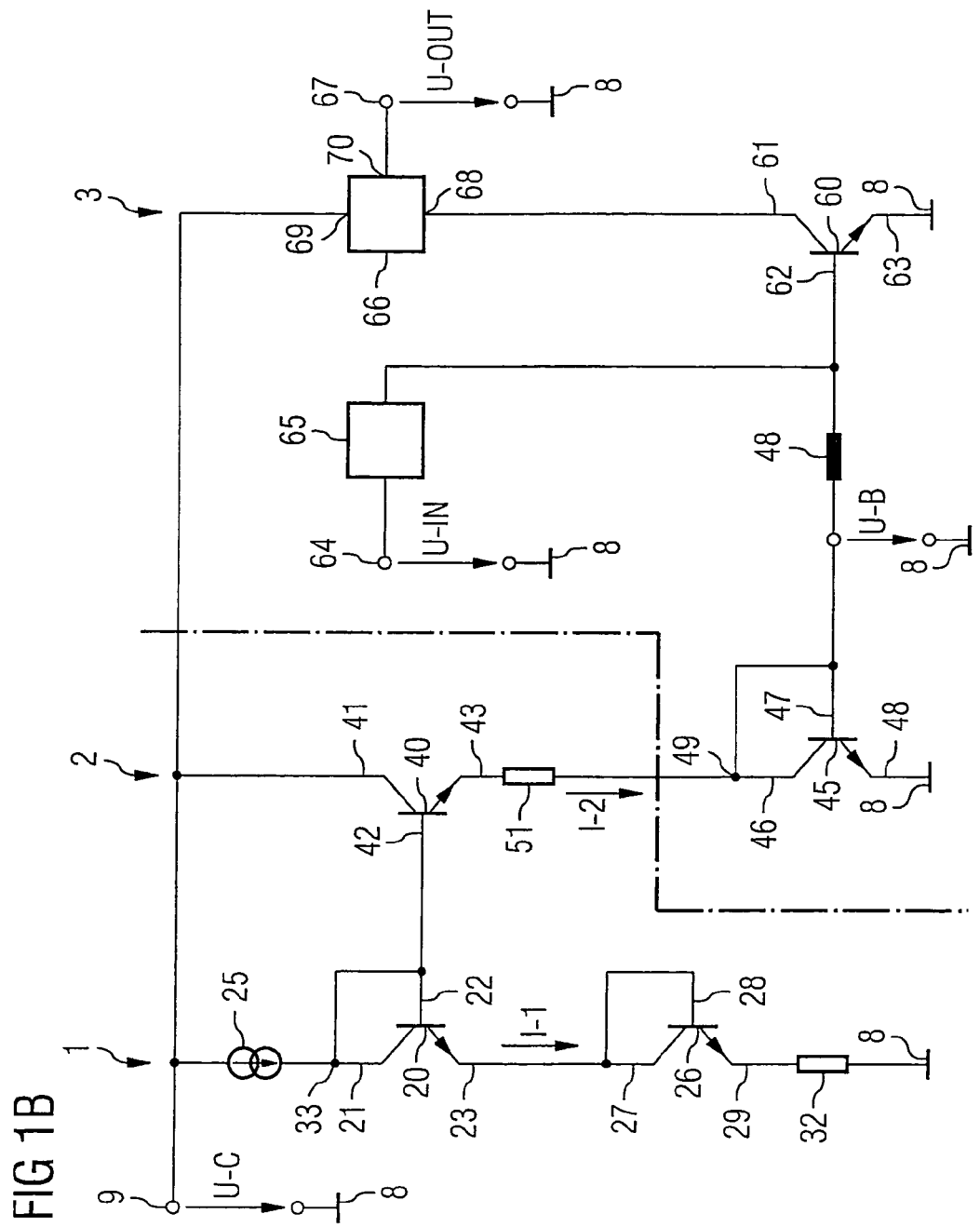
Figure 1C:
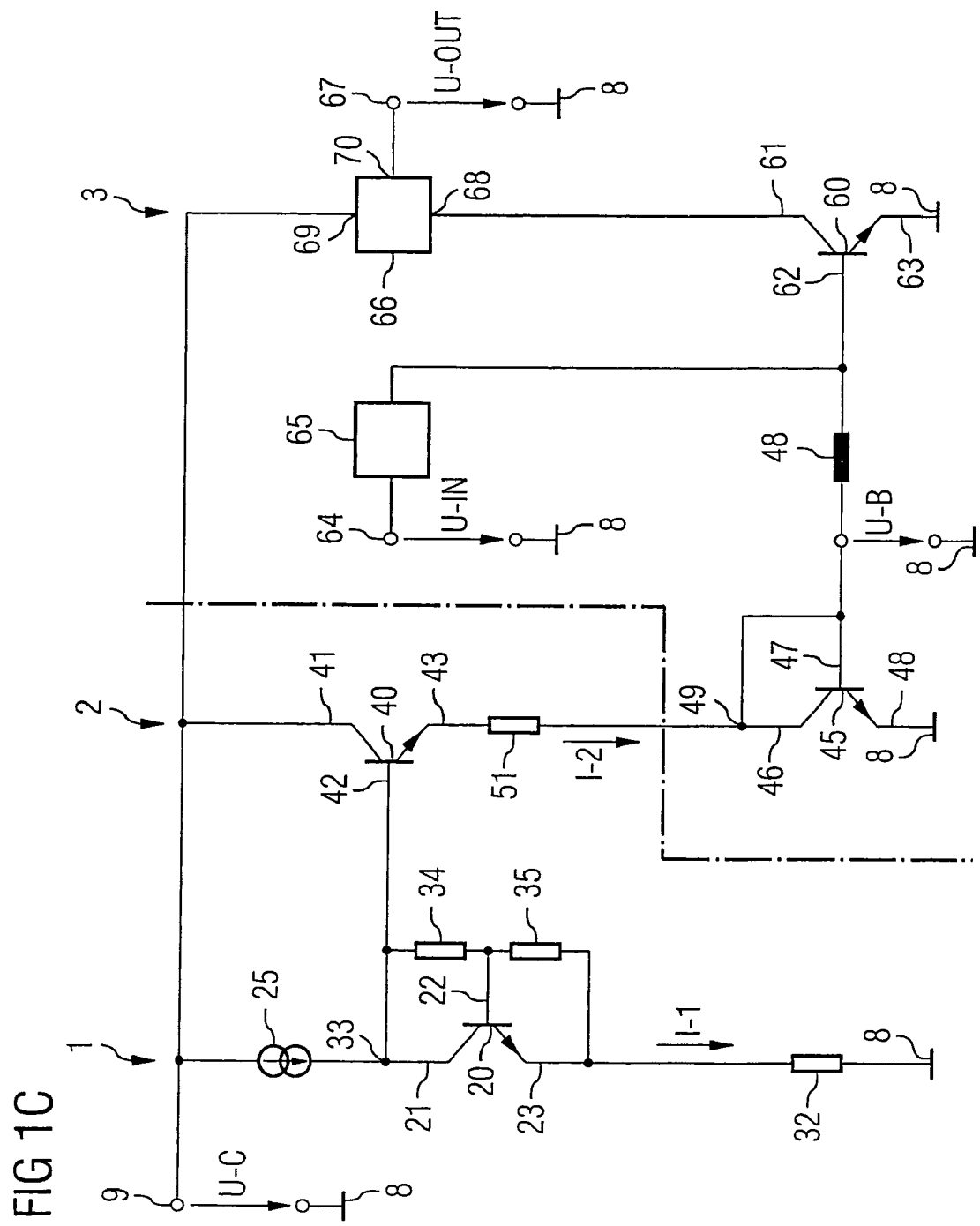

FIGS. 1A to 1C show exemplary amplifier circuits comprising a first series circuit 1 and a second series circuit 2 and an amplifier stage 3 according to the proposed principle.

FIG. 1A shows a first series circuit 1 comprising a first resistance 32 which is connected, by means of one connection, to the reference potential connection 8 and, by means of another connection, to a second connection 23 of a fourth transistor 20. A first connection 21 of the fourth transistor 20 is connected to a control connection 22 of the fourth transistor 20 and to one connection of a current source 25 which is coupled, at its further connection, to a supply potential connection 9 for supplying the supply voltage U-C. A first tap 33 is situated between the first connection 21 of the fourth transistor 20 and the current source 25.

The second series circuit 2 comprises a first transistor 40 and a second resistance 51. A control connection 42 of the first transistor 40 is coupled to the first tap 33. A first connection 41 of the first transistor 40 is connected to the supply voltage connection 9. A second connection 43 of the first transistor 40 is coupled to one connection of the second resistance 51. Another connection of the second resistance 51 is connected to the second tap 49. A bias voltage U-B can be output at the second tap 49.

The amplifier stage 3 comprises a fifth transistor 45 which is connected between the second tap 49 and the reference potential connection 8. A first connection 46 of the fifth transistor 45 is connected to a control connection 47 of the fifth transistor 45. A second connection 48 of the fifth transistor 45 is connected to the reference potential connection 8. The bias voltage U-B is supplied to a control input 62 of a second transistor 60 via a third impedance 48. The third impedance 48 is advantageously implemented using a coil for radio-frequency decoupling.

A first connection 61 of the second transistor 60 is coupled to the supply voltage connection 9 via a matching network 66. The first connection 61 of the transistor 60 is also connected, via the matching network 66, to an output 67 of the amplifier arrangement for outputting an amplified voltage U-OUT. A second connection 63 of the second transistor 60 is connected to a reference potential connection 8.

A signal U-IN to be amplified is supplied to the amplifier circuit via an input 64. The input 64 is coupled to the control connection 62 of the second transistor 60 by means of a further matching network 65.

The current I-1 which is provided by the current source 25 and is a reference current is mirrored into the second series circuit 2 by the first series circuit 1. A current I-2 flows in the second series circuit 2. The components between the first tap 33 and the reference potential connection 8 in the first series circuit and the components between the control connection 42 of the first transistor 40 of the second series circuit 2 and the reference potential connection 8 give rise to the temperature response which is used to generate the second current I-2 and the voltage U-B at the second tap 49. As a result of the first series circuit 1 being coupled to the second series circuit 2, the voltage drop between the control connection 22 and the second connection 23 of the fourth transistor 20 plus the voltage drop across the first resistance 32 is equal to a voltage drop between the control connection 42 and the second connection 43 of the first transistor 40 plus the voltage drop across the second resistance 51 and the voltage drop across the controlled path between the first connection 46 and the second connection 48 of the fifth transistor 45.

Depending on the embodiment of a diode, a temperature coefficient of a forward voltage of a diode may be approximately −2 mV/K. Since the number of diodes in the coupled sections is one in the first series circuit 1 and two in the second series circuit 2 plus the fifth transistor 45, the bias voltage U-B and the second current I-2 have a temperature coefficient.

At least one of the four transistors shown can be implemented in the form of an npn bipolar transistor and at least one further transistor can be implemented in the form of a pnp bipolar transistor.

In this example, the first, second, fourth and fifth transistors 20, 40, 45, 60 are advantageously implemented in the form of npn bipolar transistors in the amplifier circuit shown in FIG. 1A. Alternatively, these four transistors may also be produced in the form of pnp bipolar transistors or field effect transistors.

Transistors of one type may thus be advantageously used to set the operating point of the amplifier stage 3.

In an alternative embodiment, the resistances 32, 51 may be omitted and may be replaced with a conductive connection.

FIG. 1B shows an exemplary amplifier circuit according to another embodiment of the invention, which is a variation of the amplifier circuit shown in FIG. 1A.

Supplementary to the amplifier circuit shown in FIG. 1A, the amplifier circuit shown in FIG. 1B comprises a third transistor 26 in the first series circuit 1.

A first connection 27 of the third transistor 26 is connected to a control connection 28 of the third transistor 26. The third transistor 26 is connected, by means of its controlled path between the first connection 27 and the second connection 29, between the fourth transistor 20 and the first resistance 32. In an alternative embodiment, the third transistor 26 is connected between the first resistance 32 and the reference potential 8.

In the embodiment shown in FIG. 1B, the first current I-1 in the first series circuit 1 flows through two diodes and the first resistance 32; the second current I-2 in the second series circuit 2 plus the fifth transistor 45 likewise flows through two diodes and the resistance 51. If the diodes or the paths in the transistors between the control connection and the first connection exhibit the same current/voltage behavior, the diode voltages balance each other out, with the result that the ratio between the first current I-1 and the second current I-2 is independent of the temperature. An identical current/voltage behavior can be achieved by the components having the same design and the same materials, for example, also approximately the same dopant profiles and thus approximately the same temperature coefficients. Approximately the same geometrical dimensions are also advantageous for approximately the same temperature coefficients. Since they are advantageously implemented on a semiconductor body, they are approximately at the same temperature during operation, in one example.

In FIG. 1B, the second current I-2 and the bias voltage U-B are determined by the size of the second resistance 51 in relation to the size of the first resistance 32. If the second resistance 51 is smaller than the first resistance 32, a current I-2 which is larger than the current I-1 generated by the current source 25 flows.

If the second transistor 60 has approximately the same current/voltage behavior as the fifth transistor 45, a current of approximately the same magnitude as the second current I-2 advantageously flows through the second transistor 60. The temperature coefficient of the current flowing through the second transistor 60 is approximately equal to the temperature coefficient of the current provided by the current source 25. In an alternative embodiment, the resistances 32, 51 may be omitted and may be replaced with a conductive connection. The ratio between the first current I-1 and the second current I-2 is then approximately 1.

FIG. 1C shows an exemplary amplifier arrangement according to yet another embodiment of the invention, which represents another development of the amplifier arrangement shown in FIG. 1A.

Supplementary to the amplifier circuit shown in FIG. 1A, the amplifier circuit shown in FIG. 1C has a sixth resistance 34 and a seventh resistance 35. The sixth resistance 34 couples the first connection 21 of the fourth transistor 20 to the control connection 22 of the fourth transistor 20. The control connection 22 is connected to the second connection 23 of the fourth transistor 20 by means of the seventh resistance 35. The first tap 33 is situated between the first connection 21 of the fourth transistor 20 and the current source 25.

When the fourth transistor 20 is implemented in the form of an npn bipolar transistor, the first connection 21 is formed by a collector, the second connection 23 is formed by an emitter and the control connection 22 is formed by a base. The fourth transistor 20 and the sixth and seventh resistances 34, 35 form a multiplier for a base/emitter voltage.

A scalable diode voltage can be set in the first series circuit 1 using the ratio between the sixth resistance 34 and the seventh resistance 35. The diode voltages of the first and fifth transistors 40, 45 are thus compensated for in one embodiment.

In another embodiment, overcompensation in which the collector/emitter voltage of the fourth transistor 20 is greater than two diode voltages is achieved. A temperature coefficient of the second current I-2 which is opposite (+/−, −/+) in comparison with an embodiment without overcompensation is thus achieved.

Selecting the sixth and seventh resistances 34, 35 thus makes it possible to vary the currents and voltages in the first and second series circuits 1, 2 in such a manner that the bias voltage U-B and the second current I-2 are generated with temperature coefficients which can be specifically set.

The temperature coefficient of the bias voltage U-B can be advantageously used to compensate for a temperature coefficient of the gain factor of the second transistor 60 in the amplifier stage 3, with the result that the conversion of the signal U-IN to be amplified into the amplified signal U-OUT is virtually independent of the temperature.

Figure 2:
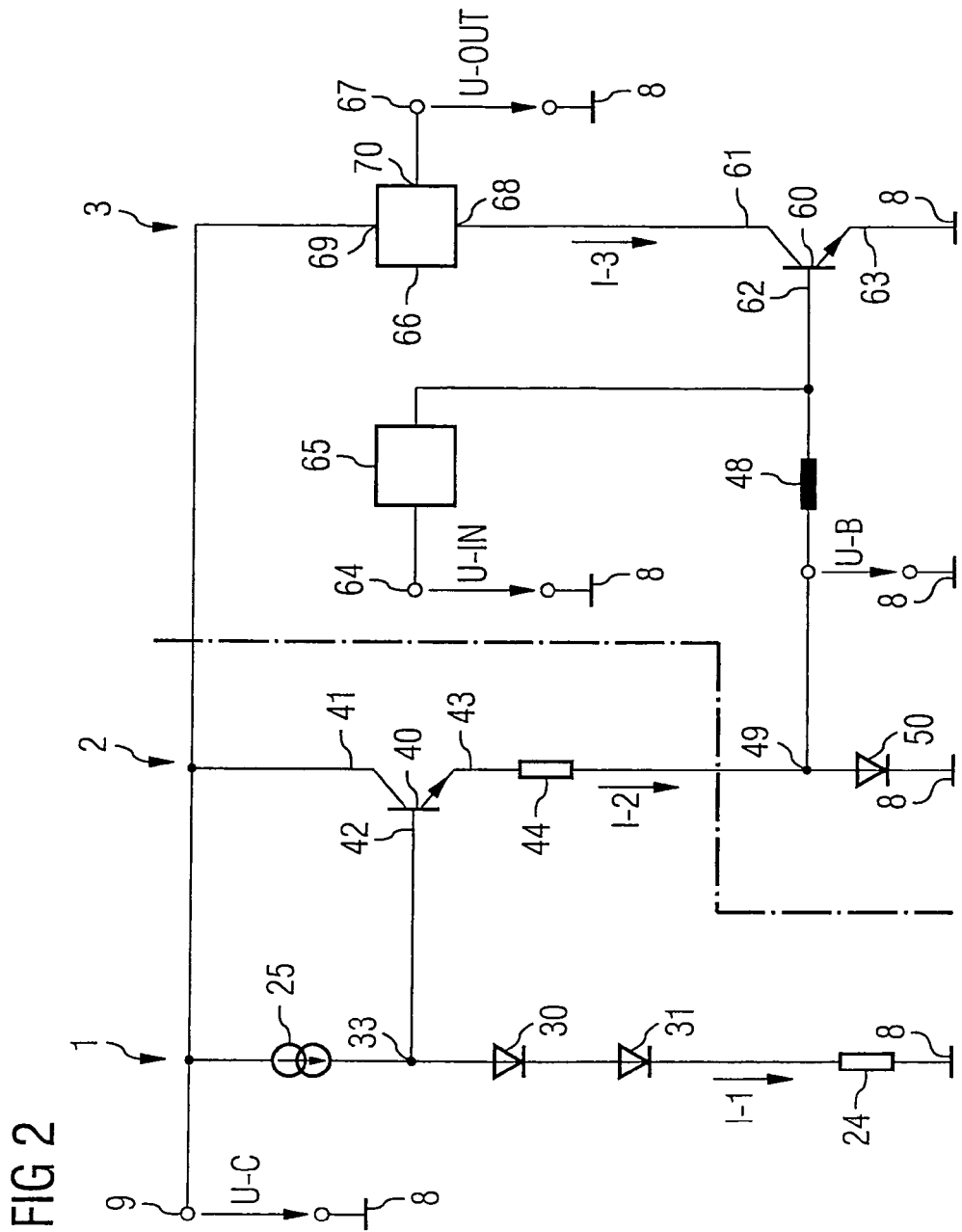
FIG. 2 is a schematic diagram illustrating an exemplary amplifier circuit according to an embodiment of the invention, which provides diodes instead of transistors.

FIG. 2 shows an exemplary amplifier circuit comprising a first series circuit 1 and a second series circuit 2 and an amplifier stage 3 according to another embodiment of the invention.

The first series circuit 1 comprises a first impedance 24 which is coupled, by means of one connection, to the reference potential connection 8 and, by means of another connection, to one connection of a component 30 which is connected as a diode. Another connection of the component 30 which is connected as a diode is connected to one connection of the current source 25. Another connection of the current source 25 is connected to the supply potential connection 9 for supplying the supply voltage U-C. The first tap 33 is situated between the first component 30, which is connected as a diode, and the current source 25.

The second series circuit 2 comprises the first transistor 40 and a second impedance 44. The control connection 42 of the first transistor 40 is coupled to the first tap 33. The first connection 41 of the first transistor 40 is connected to the supply voltage connection 9. The second connection 43 of the first transistor 40 is coupled to one connection of the second impedance 44. Another connection of the second impedance 44 is connected to the second tap 49. A bias voltage U-B is output at the second tap 49.

The amplifier stage 3 comprises a second component 50 which is connected as a diode and is connected between the second tap 49 and the reference potential connection 8. The bias voltage U-B is supplied to a control input 62 of a second transistor 60 via a third impedance 48. The third impedance 48 is advantageously implemented using a coil for radio-frequency decoupling.

The further design of the amplifier stage corresponds to the design of the amplifier stage in FIG. 1A.

The current I-1 provided by the current source 25 is mirrored, by the first series circuit 1, into the second series circuit 2 in which the current I-2 flows. The components between the first tap 33 and the reference potential connection 8 in the first series circuit and the components between the control connection 42 of the first transistor 40 of the second series circuit 2 and the reference potential connection 8 give rise to the temperature response which is used to generate the second current I-2 and the voltage U-B at the second tap 49. If one diode and one impedance are situated in the path which was mentioned first and two diodes and one impedance are situated in the path which was mentioned second, the bias voltage U-B and the second current I-2 are dependent on the temperature.

If, in another embodiment, a third component 31 which is connected as a diode is provided in the first series circuit between the first tap 33 and the reference potential connection 8, two diodes are present in the two paths mentioned. If this total of four diodes have an approximately identical current/voltage behavior, the temperature influences of the diodes compensate for each other. The ratio between the second current I-2 in the second series circuit 2 and the first current I-1 in the first series circuit 1 is then determined, in particular, by the ratio between the second impedance 44 and the first impedance 24. If the first impedance 24 and the second impedance 44 are identical, the second current I-2 is essentially equal to the first current I-1 and exhibits only the temperature coefficient with which the current source outputs the first current I-1.

If the second impedance 44 is smaller than the first impedance 24, the second current I-2 has a larger value than the first current I-1. A small current which is generated by the current source 25 is thus advantageously mirrored into a larger current. This larger current generates a voltage U-B, which is used to set the operating point of the second transistor 60, at the third component 50 which is connected as a diode.

Transistors of one type and diodes can thus advantageously be used to set the operating point of the amplifier stage 3.

In an alternative embodiment, the first and second impedances 24, 44 may be omitted and may be replaced with a conductive connection. The ratio between the first current I-1 and the second current I-2 is then approximately 1.

Figure 3A:
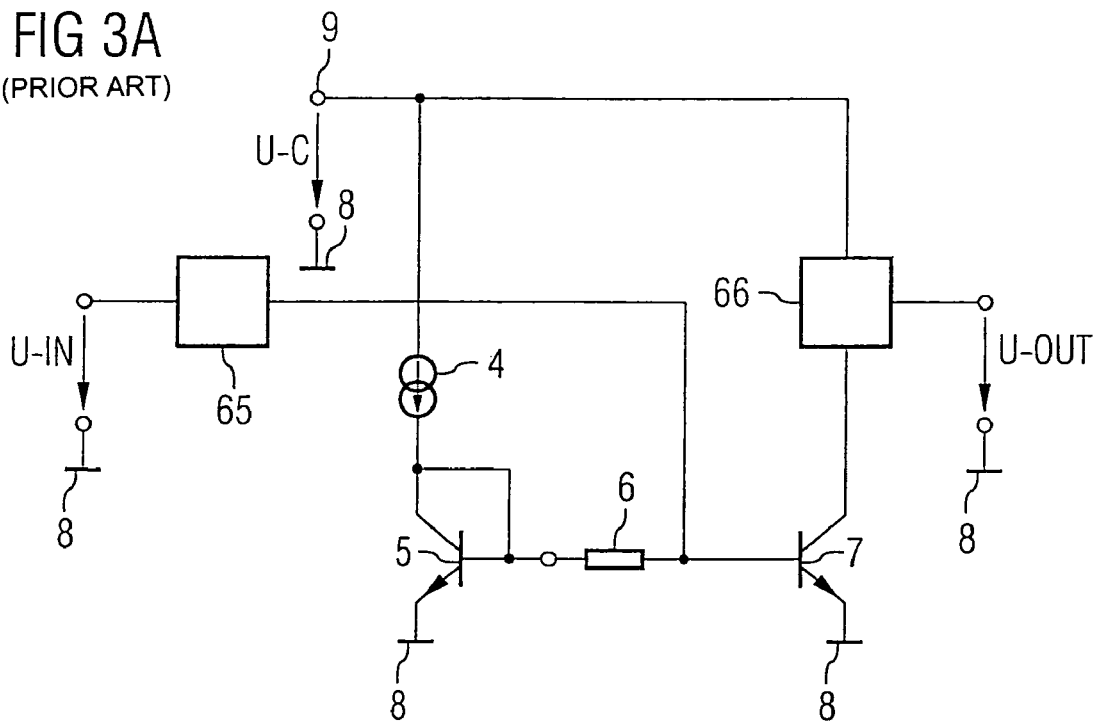
FIGS. 3A and 3B are schematic diagrams illustrating a known amplifier circuit and a known circuit for generating a bias voltage.
Figure 3B:
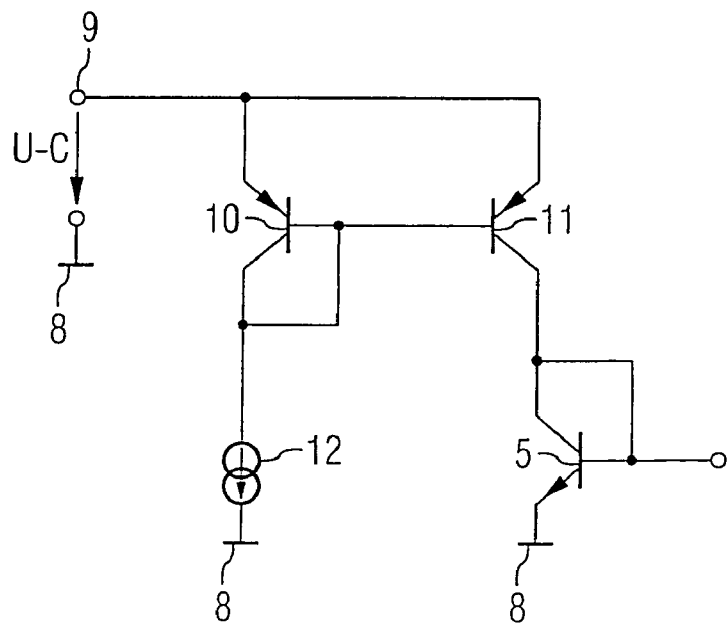

FIGS. 3A and 3B show a known amplifier circuit and a known circuit for generating a bias voltage. Since they are described in the introduction to the description, repetition of the explanation will be dispensed with here.

In one embodiment, the amplifier circuit comprises the first and second series circuits and the amplifier stage. The first series circuit comprises the current source to which the first component, which is connected as a diode, is coupled. The first impedance is coupled to the first component which is connected as a diode. The first tap is situated between the current source and the first component which is connected as a diode. The second series circuit comprises the controlled path of the first transistor, which is between the first and second connections of the first transistor. The control connection of the first transistor is coupled to the first tap. The second impedance is serially connected to the controlled path of the first transistor. The second impedance is in turn connected to the second tap which is used to output the bias voltage. The amplifier stage is coupled to the second tap for setting the operating point of the amplifier stage.

Coupling the control connection of the first transistor to the first tap results, in one embodiment, in the voltage between the first tap and the reference potential connection being identical to the voltage between the control connection of the first transistor and the reference potential. A first current, which flows in the first series circuit during operation, is thus mirrored into a second current, which flows in the second series circuit during operation. The voltage between the first tap and the reference potential is dropped, in the first series circuit, across the first component which is connected as a diode and the first impedance. The voltage drop between the control connection of the first transistor and the reference potential is composed of the voltage drop between the control connection and the second connection of the first transistor and the voltage drop across the second impedance and the voltage drop between the second tap and the reference potential.

One advantage of the embodiment of the amplifier circuit is that, by selecting a value of the first impedance and a value of the second impedance and by selecting the magnitude of the current provided by the current source, the magnitude of the second current flowing in the second series circuit can be set.

In an alternative embodiment, the first and second impedances may be omitted and may be replaced with a conductive connection.

In one embodiment, the amplifier stage comprises a second component which is connected as a diode. The coupling between the second tap and the reference potential connection exhibits the second component which is connected as a diode. The voltage between the first tap and the reference potential connection is dropped across the first diode and the first impedance. In contrast, the voltage between the control connection of the first transistor and the reference potential connection is dropped across a diode of the first transistor between the control connection and the second connection and across the second impedance and across the second component which is connected as a diode. A voltage drop across a diode is dependent on the temperature. Since the number of diodes across which the voltage is dropped in the first series circuit is smaller than the number of diodes across which the voltage is dropped in the second series circuit together with the second component which is connected as a diode, the bias voltage and the second current are thus dependent on the temperature. This can be advantageously used to compensate for temperature dependence in the amplifier stage.

In one embodiment, the amplifier stage comprises a second transistor. A controlled path between a first connection and a second connection of the second transistor is connected between the supply voltage connection and the reference potential connection. A control connection of the second transistor is coupled to the second tap.

In one embodiment, the amplifier stage comprises a matching network which couples the first connection of the second transistor to the supply voltage connection and to the output of the amplifier stage for outputting an amplified signal. In one embodiment, the matching network has coupling having a low-pass characteristic for connecting the second connection of the transistor to the supply voltage connection and further coupling having a high-pass characteristic for connecting the second connection of the second transistor to the output of the amplifier stage.

In another embodiment, the matching network has a resistance which connects the first connection of the second transistor to the supply voltage connection. In one example, the matching network comprises a capacitor which couples the first connection of the second transistor to the output of the amplifier stage.

In one embodiment, one input which has the signal to be amplified applied to it is connected to the control connection of the second transistor via a further matching network. In one example, the further matching network exhibits high-pass properties. In one preferred embodiment, the further matching network comprises a capacitor.

In one embodiment, an input of a further amplifier stage is connected to the output of the amplifier stage. In this case, a further matching network of the further amplifier stage is formed using a line since the DC decoupling between the output of the amplifier stage and the input of the further amplifier stage is effected using a capacitor in the matching network of the amplifier stage.

A plurality of amplifier stages of said type can be combined. In one embodiment, three amplifier stages are connected in series. Bias voltages which are matched to the respective operating points of the further amplifier stages are each generated, in one embodiment, using further first and second series circuits. In one example, the operating points for at least two series-connected amplifier stages are set using the first and second series circuits.

In another embodiment, at least two amplifier stages are connected in a parallel manner on the input and output sides. In this case, the first and second series circuits are provided for the purpose of setting the operating point. Alternatively, a first and a second series circuit are respectively provided for separately setting the operating point of each of the at least two parallel-connected amplifier stages.

In one embodiment, a differential amplifier circuit comprises the first and second series circuits and the amplifier stage, the amplifier stage comprising a first and a second controllable path whose inputs have a first and a second signal, whose difference is to be amplified, applied to them. A first and a second amplified voltage are output at the output. The first and second controllable paths are coupled to one another. In one embodiment, the coupling may be a resistance which connects the reference potential connection to a node, to which the first and second controllable paths are connected. A further resistance may advantageously be provided between the second component, which is connected as a diode, and the reference potential connection as well as in the first series circuit for the purpose of compensation. The first and second series circuits thus advantageously set the same operating point in both controllable paths.

In one embodiment, the first series circuit comprises a third component which is connected as a diode. The third component which is connected as a diode is connected between the first component, which is connected as a diode, and the first impedance or between the first impedance and the reference potential connection. One advantage of this embodiment is that two diodes and one resistance are respectively connected between the first tap and the reference potential connection and between the control connection of the first transistor and the reference potential connection. The diodes are connected in such a manner that they can be operated in the forward direction. One advantage of this arrangement is that the influence of temperature on the circuit is reduced by virtue of the voltages across the diodes being at least partially compensated for. The currents through the first and second series circuits together with the second component, which is connected as a diode, thus have the temperature coefficient exhibited by the single component which determines the temperature coefficient, the current source.

The first component which is connected as a diode comprises a fourth transistor in one embodiment. A first connection and a control connection of the fourth transistor are coupled to one another.

In another embodiment, the second component which is connected as a diode likewise comprises a fifth transistor in which a first connection and a control connection are connected to one another.

According to an alternative embodiment, the third component which is connected as a diode comprises a third transistor. In this embodiment, a first connection of the third transistor and a control connection of the third transistor are coupled to one another.

The first impedance may comprise a first resistance. The second impedance may likewise comprise a second resistance.

In one embodiment, the first, third, fourth and fifth transistors have an approximately identical current/voltage behavior. The four transistors thus exhibit an essentially identical behavior in their input and output characteristic curves. One advantage of this embodiment is that, as a result of the approximately identical input characteristic curves of the four transistors, the two voltages across the diodes in the first series circuit can be canceled by the two voltages across the two diodes in the second series circuit plus the fifth transistor. The voltage drop across the first resistance and that across the second resistance are thus identical. In one embodiment, as a result of a value being selected for the second resistance which is larger than the value for the first resistance, the second current is generated with a value which is smaller than a value of the first current.

In one embodiment, the second resistance has a smaller resistance value than the first resistance. A larger current than in the first series circuit is thus advantageously generated in the second series circuit. The current source is thus advantageously designed to generate a small current.

As a result of the control connection of the second transistor being coupled to the second tap, the voltage drop between the control connection and the first connection of the fifth transistor is approximately equal to the voltage drop between the control connection and the second connection of the second transistor in one embodiment.

In one embodiment, the second transistor has, between the control connection and the second connection, and the fifth transistor has, between the control connection and the second connection, an essentially identical current/voltage behavior. The diode between the control connection and the second connection of the second and fifth transistors thus exhibits approximately the same characteristics as the input characteristic curve. This advantageously results in the direct current through the controlled path of the second transistor having a constant ratio to the direct current through the controlled path of the fifth transistor.

In one embodiment, the second transistor and the fifth transistor have an approximately identical behavior in the input and output characteristic curves. This advantageously makes it possible for a value of the current through the second transistor to be essentially equal to the value of the second current through the second series circuit. On account of the second series circuit being coupled to the first series circuit, the direct current through the second transistor has a constant and temperature-independent ratio to the first current output by the current source.

In one embodiment, the first connection of the fourth transistor is connected to the control connection of the fourth transistor via a sixth resistance. In another embodiment, the control connection of the fourth transistor is connected to the second connection of the fourth transistor via a seventh resistance. In one embodiment, the control connection of the fourth transistor is connected to the first connection via the sixth resistance and is connected to the second connection of the fourth transistor via the seventh resistance. The current/voltage behavior in the first series circuit is thus changed. Since impedance values of resistances generally have a lower temperature dependence than the transmission properties of transistors, the temperature response in the first series circuit can advantageously be set differently using the sixth and seventh resistances. This advantageously makes it possible to specifically establish temperature dependence of the second current and of the bias voltage.

In one embodiment, such temperature setting of the bias voltage is used to compensate for any temperature dependence of the transmission response of the second transistor. An amplifier circuit having a very slight temperature influence on a gain factor is thus implemented.

Like the fourth transistor, the third transistor may also be connected to one or two resistances.

In one exemplary embodiment, at least one of the transistors is in the form of a field effect transistor. In one embodiment, the first, second, third, fourth and fifth transistors are in the form of p-channel field effect transistors. Alternatively, the transistors are in the form of n-channel field effect transistors and advantageously have a larger current with the same area.

Alternatively, at least one of the transistors is in the form of a bipolar transistor. In one embodiment, the first, second, third, fourth and fifth transistors are in the form of pnp bipolar transistors. The first, second, third, fourth and fifth transistors are preferably in the form of npn bipolar transistors.

In one embodiment, the first, third, fourth and fifth transistors have an approximately identical design.

In one embodiment, the amplifier stage comprises a third impedance. The latter is provided for the purpose of coupling the control connection of the second transistor to the second tap. The third impedance advantageously comprises a low-pass filter since the voltage to be amplified thus acts on the second transistor and not on the second component, which is connected as a diode, or the fifth transistor. The third impedance comprises a coil in one embodiment and thus advantageously enables good DC voltage coupling of the second transistor to the second tap.

In one embodiment, the amplifier stage and the first and second series circuits are implemented on different semiconductor bodies. Technologies which are provided for driving relatively large currents can thus be advantageously used to implement the second transistor which may be a power transistor.

The amplifier may be alternatively integrated in a semiconductor body. One advantage of integration is that line lengths are shortened, crosstalk from radio-frequency signals is reduced, the thermal synchronism of the transistors is improved and the number of contacts and thus the outlay on contact-connection are kept small and the reliability of the amplifier circuit is increased.

In one embodiment, a method for amplifying the signal to be amplified into an amplified signal comprises the following steps:

A first current which is provided as a reference current is formed. A second current which represents a mirror current with respect to the reference current is generated. The ratio between a value of the second current and a value of the reference current is set. The second current is used to generate a bias voltage which is used to supply an amplifier stage.

A signal to be amplified is supplied to an input of the amplifier stage. A signal which has been amplified by the amplifier stage is output at an output of the amplifier stage.

Transistors which, in one embodiment, are of the same type as the transistor of the amplifier stage can be used to generate the bias voltage or a bias current.

The mirror ratio, namely the ratio between the current flowing in the second series circuit and the current flowing in the first series circuit, can be set, in one embodiment, using the resistance ratio, namely the ratio between the first resistance and the second resistance.

If, in an alternative embodiment, the resistances are omitted and are replaced with a conductive connection, the mirror ratio is approximately 1.

In one embodiment, the amplifier circuit may generate a bias voltage with a specific temperature setting.

The amplifier circuit can be implemented in different embodiments with different types of transistor. npn bipolar transistors or the pnp bipolar transistors which are complementary to the latter may thus be provided. The amplifier circuit may likewise be implemented using n-channel field effect transistors or else the p-channel field effect transistors which are complementary to the latter.

The invention claimed is:

1. An amplifier circuit, comprising
a first series circuit connected between a supply voltage connection and a reference potential connection, wherein the first series circuit comprises:
a current source;
a first tap connected between the current source and the reference potential connection;
a first component configured as a diode and a first impedance which are connected in series between the first tap and the reference potential connection;
a second series circuit connected between the supply voltage connection and the reference potential connection, and configured to mirror a first current which flows in the first series circuit with scaling to form a second current, wherein the second series circuit comprises:
a controlled path between a first connection and a second connection of a first transistor whose control connection is coupled to the first tap; and
a second impedance connected between the controlled path of the first transistor and the reference potential connection, having a first connection connected to the controlled path of the first transistor and a second connection connected to a second tap at which a bias voltage is tapped off, a ratio between the second current flowing in the second series circuit and the first current depends on the first and second impedances;
an amplifier stage coupled to the second tap, wherein the bias voltage thereat sets an operating point of the amplifier stage.

2. The amplifier circuit of claim 1, wherein the amplifier stage further comprises a second component connected as a diode, and connected between the second tap and the reference potential connection.

3. The amplifier circuit of claim 2, wherein the amplifier stage further comprises a second transistor having a controlled path extending between a first connection and a second connection of the second transistor, and connected between the supply voltage connection and the reference potential connection, and comprising a control connection coupled to the second tap.

4. The amplifier circuit of claim 1, wherein the first impedance comprises a first resistance and the second impedance comprises a second resistance.

5. The amplifier circuit of claim 2, wherein the first series circuit further comprises a third component configured as a diode and connected between the first component and the first impedance, or between the first impedance and the reference potential connection.

6. An amplifier circuit, comprising:
a first series circuit connected between a supply voltage connection and a reference potential connection, wherein the first series circuit comprises:
a current source;
a first tap connected between the current source and the reference potential connection;
a first component configured as a diode, and a first impedance in series therewith connected between the first tap and the reference potential connection;
a second series circuit connected between the supply voltage connection and the reference potential connection wherein the second series circuit comprises:
a controlled path extending between a first connection and a second connection of a first transistor, the first transistor further comprising a control connection coupled to the first tap; and
a second impedance connected between the controlled path of the first transistor and the reference potential connection, having a first connection connected to the controlled path of the first transistor and a second connection connected to a second tap forming a bias voltage node;
an amplifier stage coupled to the second tap, wherein the bias voltage node sets an operating point of the amplifier stage and comprises:
a second component configured as a diode and connected between the second tap and the reference potential connection;
a second transistor comprising a controlled path extending between a first connection and a second connection of the second transistor wherein the controlled path is connected between the supply voltage connection and the reference potential connection; and
a third impedance which comprises a coil and couples a control connection of the second transistor to the second tap.

7. The amplifier circuit of claim 6, wherein the amplifier stage further comprises a matching network which, at a first connection, is connected to the first connection of the second transistor and, at a second connection, is connected to the supply voltage connection and, at a third connection, is connected to an output of the amplifier stage.

8. The amplifier circuit of claim 6, wherein a control connection of the second transistor is coupled, via a further matching network, to an input of the amplifier circuit that is coupled to the bias voltage node.

9. The amplifier circuit of claim 6, wherein the first series circuit further comprises a third component that is configured as a diode and is connected between the first component, and the first impedance, or between the first impedance and the reference potential connection.

10. An amplifier circuit, comprising:
a first series circuit connected between a supply voltage connection and a reference potential connection wherein the first series circuit comprises:
a current source;
a first tap connected between the current source and the reference potential connection; and
a first transistor having a first connection and a control connection coupled to one another, wherein the first transistor is connected between the first tap and the reference potential connection;
a second series circuit connected between the supply voltage connection and the reference potential connection, wherein the second series circuit is configured to mirror a first current, which flows in the first series circuit, with scaling, and comprises:
a controlled path between a first connection and a second connection of a second transistor having a control connection coupled to the first tap; and
a second tap coupled to the controlled path of the second transistor, wherein the first and second series circuits cooperatively operate to generate a bias voltage thereof;
an amplifier stage coupled to the second tap, wherein the bias voltage sets an operating point of the amplifier stage, wherein the amplifier stage further comprises a third transistor having a first connection and a control connection coupled to one another and, wherein the third transistor is connected between the second tap and the reference potential connection.

11. The amplifier circuit of claim 10, further comprising a first resistance coupling the first connection of the first transistor to the control connection of the first transistor, and a second resistance coupling the control connection of the first transistor to a second connection of the first transistor.

12. An amplifier circuit, comprising:
a first series circuit connected between a supply voltage connection and a reference potential connection wherein the first series circuit comprises:
a current source;
a first tap connected between the current source and the reference potential connection; and
a first transistor having a first connection and a control connection coupled to one another, wherein the first transistor is connected between the first tap and the reference potential connection;
a second series circuit connected between the supply voltage connection and the reference potential connection, wherein the second series circuit is configured to mirror a first current, which flows in the first series circuit, with scaling, and comprises:
a controlled path between a first connection and a second connection of a second transistor having a control connection coupled to the first tap; and
a second tap coupled to the controlled path of the second transistor, wherein the first and second series circuits cooperatively operate to generate a bias voltage thereof;
an amplifier stage coupled to the second tap, wherein the bias voltage sets an operating point of the amplifier stage,
wherein the first series circuit further comprises a first impedance connected in series with a controlled path of the first transistor; and
wherein the second series circuit further comprises a second impedance connected between the controlled path of the second transistor and the second tap, a ratio between the second current flowing in the second series circuit and the first current depends on the first and second impedances.

13. The amplifier circuit of claim 12, wherein the first impedance comprises a first resistance and the second impedance comprises a second resistance.

14. An amplifier circuit, comprising:

a first series circuit connected between a supply voltage connection and a reference potential connection wherein the first series circuit comprises:

a current source;

a first tap connected between the current source and the reference potential connection; and a first transistor having a first connection and a control connection coupled to one another, wherein the first transistor is connected between the first tap and the reference potential connection;

a second series circuit connected between the supply voltage connection and the reference potential connection, wherein the second series circuit is configured to mirror a first current, which flows in the first series circuit, with scaling, and comprises:

a controlled path between a first connection and a second connection of a second transistor having a control connection coupled to the first tap; and a second tap coupled to the controlled oath of the second transistor, wherein the first and second series circuits cooperatively generate to generate a bias voltage thereof;

an amplifier stage coupled to the second tap, wherein the bias voltage sets an operating point of the amplifier stage, wherein the amplifier stage further comprises a third transistor having a controlled path extending between a first connection and a second connection of a fourth transistor that is connected between the supply voltage connection and the reference potential connection and having a control connection coupled to the second tap.

15. The amplifier circuit of claim 12, wherein the first series circuit further comprises a third transistor having a first connection and a control connection coupled to one another, and wherein the third transistor is connected between the controlled path of the first transistor, and the first impedance, or between the first impedance and the reference potential connection.

* * * * *

UNITED STATES PATENT AND TRADEMARK OFFICE
CERTIFICATE OF CORRECTION

PATENT NO. : 7,482,876 B2 Page 1 of 1
APPLICATION NO. : 11/494433
DATED : January 27, 2009
INVENTOR(S) : Michael Asam It is certified that error appears in the above-identified patent and that said Letters Patent is hereby corrected as shown below:

Column 16, claim 14, line 1; please replace "oath" with --path--
Column 16, claim 14, line 3; please replace "cooperatively generate" with --cooperatively operate--

Signed and Sealed this

Twenty-fourth Day of March, 2009

JOHN DOLL
*Acting Director of the United States Patent and Trademark Office*

UNITED STATES PATENT AND TRADEMARK OFFICE
CERTIFICATE OF CORRECTION

PATENT NO. : 7,482,876 B2 Page 1 of 1
APPLICATION NO. : 11/494433
DATED : January 27, 2009
INVENTOR(S) : Michael Asam It is certified that error appears in the above-identified patent and that said Letters Patent is hereby corrected as shown below:

Title page, item [75] Inventor's: replace "OT Sainbach" with --Inchenhofen, OT Sainbach--

Signed and Sealed this

Twenty-eighth Day of April, 2009

JOHN DOLL
*Acting Director of the United States Patent and Trademark Office*